(12) United States Patent
Nazarian et al.

(10) Patent No.: US 6,882,136 B2
(45) Date of Patent: Apr. 19, 2005

(54) VARIABLE IMPEDANCE NETWORK FOR AN INTEGRATED CIRCUIT POTENTIOMETER

(75) Inventors: Hagop A. Nazarian, San Jose, CA (US); William Tang, Orinda, CA (US); Zhan Duan, San Jose, CA (US); Chao-Ming Tsai, San Jose, CA (US); Lawrence D. Engh, Redwood City, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/854,657

(22) Filed: May 26, 2004

(65) Prior Publication Data

US 2004/0217751 A1 Nov. 4, 2004

Related U.S. Application Data (63) Continuation of application No. 10/102,117, filed on Mar. 20, 2002, now Pat. No. 6,788,042, which is a continuation-in-part of application No. 09/989,874, filed on Nov. 20, 2001, now Pat. No. 6,552,519.

(51) Int. Cl.[7] .................................................. H02J 3/12
(52) U.S. Cl. ........................ 323/354; 323/297; 323/298; 323/369; 341/145; 341/154
(58) Field of Search .......................... 323/293, 297–299, 323/352–354, 364, 367, 369; 341/145, 154

(56) References Cited

U.S. PATENT DOCUMENTS

| | | | |
|---|---|---|---|
| 3,590,366 A | 6/1971 | Vaughn | |
| 4,157,494 A | 6/1979 | Kornienko et al. | |
| 4,468,607 A | 8/1984 | Tanaka et al. | |
| 4,810,949 A | 3/1989 | Schiemenz et al. | |
| 4,849,903 A | 7/1989 | Fletcher et al. | |
| 5,084,667 A | * 1/1992 | Drori et al. | 323/298 |
| 5,389,872 A | * 2/1995 | Erhart et al. | 323/354 |
| 5,495,245 A | * 2/1996 | Ashe | 341/145 |
| 6,002,354 A | 12/1999 | Itoh et al. | |
| 6,127,893 A | 10/2000 | Llewellyn et al. | |
| 6,201,491 B1 | 3/2001 | Brunolli et al. | |
| 6,307,490 B1 | 10/2001 | Litfin et al. | |
| 6,331,768 B1 | 12/2001 | Drori et al. | |
| 6,552,519 B1 | * 4/2003 | Nazarian | 323/354 |
| 6,567,026 B1 | * 5/2003 | Gorman | 341/154 |
| 6,744,244 B1 | * 6/2004 | Liu et al. | 323/354 |
| 6,788,042 B1 | * 9/2004 | Nazarian et al. | 323/354 |

\* cited by examiner

*Primary Examiner*—Gary L. Laxton
(74) *Attorney, Agent, or Firm*—Blakely, Sokoloff, Taylor & Zafman LLP (57) ABSTRACT

An impedance network, which includes at least one end terminal, a wiper terminal, a center impedance element, and a first plurality of impedance elements. The wiper terminal provides a tap position at a selected impedance value of the impedance network, selectable at a specified increment value. The first plurality of impedance elements is configured to reduce resistance variation during switching from one tap position to another tap position. The first plurality of impedance element is connected in series in a mirrored configuration about the center impedance element.

37 Claims, 7 Drawing Sheets

VARIABLE IMPEDANCE NETWORK FOR AN INTEGRATED CIRCUIT POTENTIOMETER

CROSS REFERENCE TO RELATED APPLICATIONS

This application is a continuation of U.S. patent application Ser. No. 10/102,117 filed Mar. 20, 2002, now U.S. Pat. No. 6,788,042 which is a continuation-in-part of U.S. patent application Ser. No. 09/989,874, filed Nov. 20, 2001 and entitled "Variable Impedance Network for an Integrated Circuit", now U.S. Pat. No. 6,552,519, and commonly assigned to the assignee of the present invention.

BACKGROUND

The present invention relates to variable impedance networks. More particularly, the invention relates to such variable impedance networks for an integrated circuit potentiometer.

Variable impedance networks are usually manually adjusted to provide a selected impedance so as to affect some aspect of the circuit in which the networks are located. These variable impedance networks are usually in the form of variable resistors, also called potentiometers. However, circuits using variable inductors or capacitors may also be formed.

Manual adjustment of potentiometers is usually undesirable in circuits under the control of data processing systems or other external electric circuits where ongoing adjustment of the potentiometer is necessary for circuit operation. The data processing system often must change the value of the variable impedance network in a time that is short relative to the time required to complete a manual adjustment of the variable impedance element. Therefore, special purpose integrated circuit variable impedance networks have been employed in the prior art. These networks allow the level of attenuation to be adjusted under the digital control of an external data processing system.

For example, Tanaka, et al., U.S. Pat. No. 4,468,607, teaches a ladder attenuator which is controlled by a binary number by means of a switch circuit. Depending on the stage of the switches in this switch circuit, one or more stages of attenuation are introduced into the signal path. However, teachings of Tanaka may require a large number of fixed impedance elements and switches for a large range of impedances. Accordingly, Drori, et al., U.S. Pat. No. 5,084,667, suggests a number of embodiments of variable impedance elements which minimizes the number of separate resistors required to achieve the equivalent resolution achievable using a series arrangement of resistors.

SUMMARY

The present invention, in one aspect, describes an impedance network, which includes at least one end terminal, a wiper terminal, a center impedance element, and a first plurality of impedance elements. The wiper terminal provides a tap position at a selected impedance value of the impedance network, selectable at a specified increment value. The first plurality of impedance elements is configured to reduce resistance variation during switching from one tap position to another tap position. The first plurality of impedance elements is connected in series in a mirrored configuration about the center impedance element.

In another aspect, the present invention describes a method for configuring an impedance network. The method includes first configuring a first plurality of resistors selectively connectable in parallel, and connecting a second plurality of resistive elements in series, where each resistive element includes equivalent resistance formed by the first plurality of resistors. A center resistor is provided, and the second plurality of resistive elements is configured into a mirrored configuration with respect to the center resistor. Nodes of the second plurality of resistive elements are then selectively connected to a wiper terminal of the impedance network.

DETAILED DESCRIPTION

In recognition of the above-stated challenges associated with prior art designs of variable impedance networks, alternative embodiments for a variable impedance network which reduces overhead circuits including wiper transistors are described. Consequently, for purposes of illustration and not for purposes of limitation, the exemplary embodiments of the invention are described in a manner consistent with such use, though clearly the invention is not so limited.

Figure 1A:
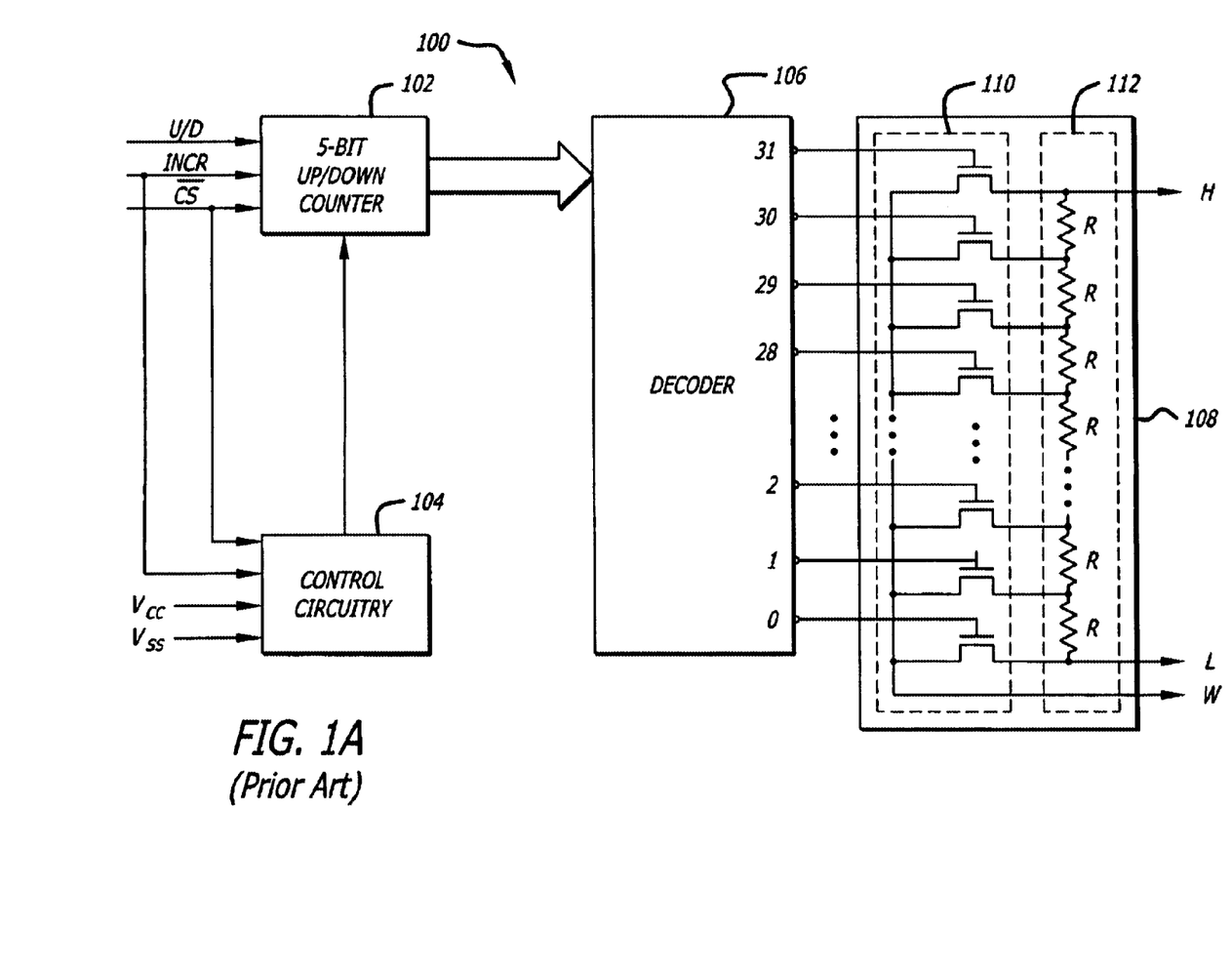
FIG. 1A shows a conventional variable resistance network.

A conventional variable resistance network 100 is illustrated in FIG. 1A. The network 100 includes a counter 102, a control circuitry 104, a decoder 106, and a network array 108 having a transistor array 110 and a resistor array 112. In the illustrated example, the network array 108 has three terminals, H, L and W. Hence, the network array 108 simulates a standard potentiometer 120, such as the one shown in FIG. 1B. Terminals H and L correspond to the end terminals, while terminal W corresponds to the center tap of the potentiometer 120.

Figures 1B, 7A:
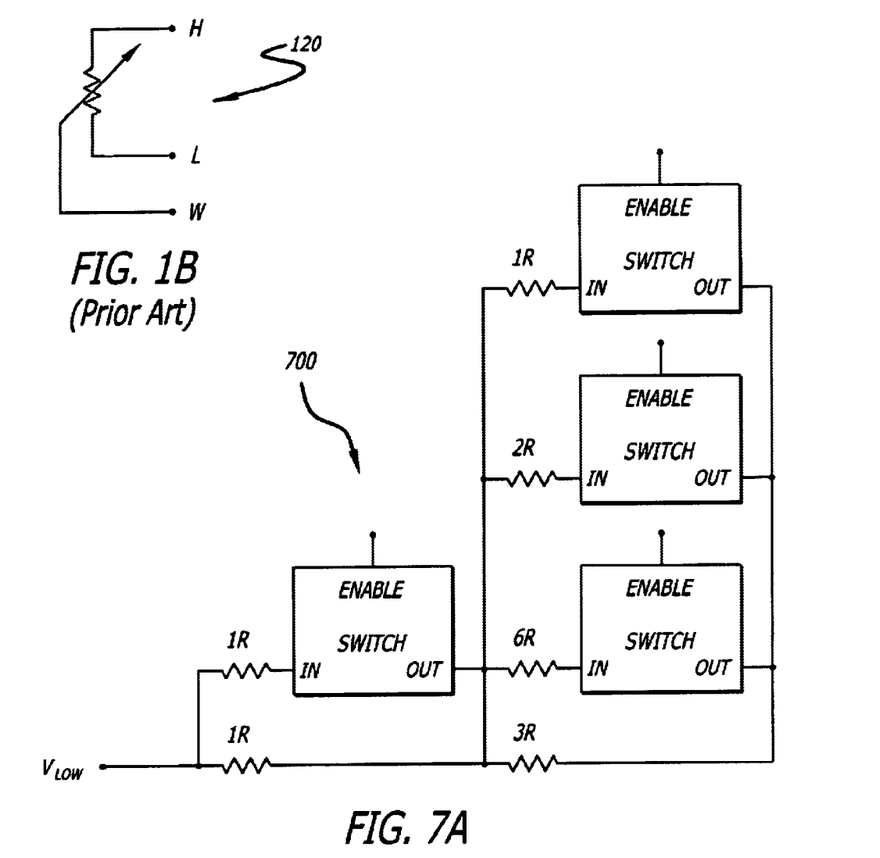
FIG. 1B shows a standard center-tapped potentiometer.
FIG. 7A shows one implementation of the trim option circuit.

In the illustrated example of FIG. 1A, the resistor array 112 includes 32 equal resistor elements (R) arranged in series to represent 32 tap positions at the wiper nodes of the potentiometer 120. However, any number of resistor elements may be used to provide smaller or larger resistance value than this example. The transistor array 110 includes wiper transistors that are used to connect various combinations of resistor elements between two terminals H and W.

The particular combination is determined by a value stored in a counter 102, which may be altered by two signals, U/D and INCR. The U/D signal determines whether the counter 102 will be incremented or decremented by a predetermined amount in response to the increment (INCR) signal. This value is coupled to a 1-of-N decoder 106, where N=32. The output of this decoder 106 controls the plurality of wiper transistors in the transistor array 110. Since N is the maximum value which may be stored in the counter 102, there are N nodes in the resistor array 112, each node corresponding to a given counter value. Each node may be coupled to terminal W by applying a signal to the corresponding wiper transistor in the transistor array 110.

The value stored in the counter 102 may be transferred to a memory in the control circuitry 104 in response to specified voltage transitions on a chip select (CS) line. The chip select line also enables the counter 102. When the chip select line is low, the counter 102 responds to signals on U/D and INCR lines. This enables the circuit controlling the variable resistance network 100 to alter the value stored in counter 102.

The control circuitry 104 also monitors supply voltages ($V_{cc}$ and $V_{ss}$) to load the value stored in the memory into the counter 102 when power is applied to the variable resistance network 100. This ensures that the last value stored in counter 102 before power was removed from the variable resistance network 100 will be restored when the power is once again applied to the variable resistance network 100.

With the above-described approach illustrated in FIGS. 1A and 1B, N wiper transistors are required to generate N tap positions. Hence, when N becomes large (e.g., N>100), the area of the die occupied by the wiper transistors may significantly increase, especially when the specification for wiper resistance is low (i.e., 50 ohms or less).

Accordingly, the present embodiments include solutions to the above-stated undesirable outcome of large N by providing a variable impedance network which requires fewer wiper transistors. Moreover, the teachings of these embodiments may be extended to include impedance networks having elements other than resistors, such as capacitors or inductors. In the below-described embodiments, the impedance network is a binary numbering scheme assigned to a plurality of serially connected resistive pairs, where each pair is connected in parallel. However, in an alternative embodiment, more than two resistors may be configured in parallel arrangement to provide wider range of resistance values, and thus, further reduce the wiper transistor count. In a further embodiment, bypass transistors may be provided to bypass certain resistors. This may also provide wider range resistance values.

Figure 2:
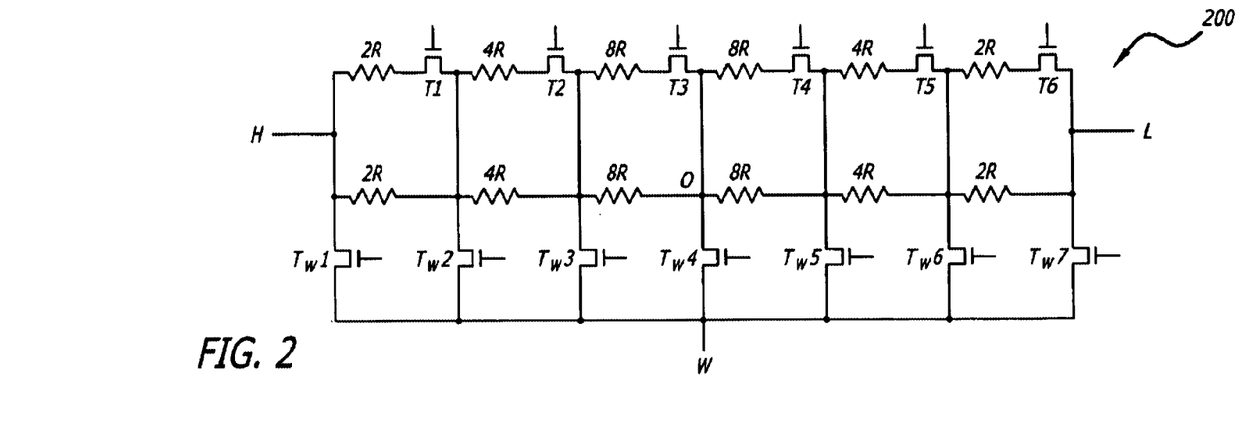
FIG. 2 illustrates an impedance network array configuration.

An impedance network array configuration 200 is illustrated in FIG. 2, in which the network array 200 is configured into a plurality of serially connected resistor pairs, where each pair is connected in parallel. Furthermore, the plurality of serially connected resistor pairs is connected with connection nodes. Resistance values of the resistor pair connected in parallel are equal. A switching element, such as a transistor, may be connected in series with one resistor of the resistive pair to either provide that resistor in parallel or to disconnect that resistor. In particular, the transistor may be a field-effect transistor (FET). Resistance values of the plurality of serially connected resistor pairs may be different. In this example, the resistance values of the plurality of serially connected resistor pairs are mirrored with respect to the center node, O. However, the mirrored configuration is not required. Furthermore, each resistor pair is selectively connected to the wiper terminal (W) through a switching element such as a transistor to select different combinations of series resistances. In particular, the transistor may be a field-effect transistor (FET).

Further, the impedance network array configuration 200 is arranged to meet two constraints. The first constraint is to keep the end-to-end resistance of the array (i.e., potentiometer) 200 constant. This constraint for constant end-to-end resistance between the end terminals H and L must be followed to ensure proper functioning of the potentiometer. The second constraint is to generate all possible taps at the variable node of the potentiometer, with each tap providing a unit resistance (R). Therefore, a 21R end-to-end resistance potentiometer with 22 1R taps may be configured as shown in FIG. 2.

To accomplish the first constraint, the binary sequence is mirrored around the center node O so that any resistance between H and W is complemented with a resistance between W and L that keeps the end-to-end resistance constant to 21R. For example, if 1R (i.e., 2R∥2R, where ∥ indicates parallel configuration) is selected on the H-to-W side by turning on transistors T1 and $T_w2$, a 20R resistance must be selected with the rest of the resistor array on the W-to-L side by turning on T2 and T3. This generates a 20R configured by (4R∥4R)+(8R∥8R)+8R+4R+2R=2R+4R+8R+4R+2R. In the illustrated embodiment, transistors labeled TX, where X is between 1 and 6, are referred to as pass transistors. Transistors labeled as $T_wX$, where X is between 1 and 7, are referred to as wiper transistors. Thus, the pass transistor allows resistors into parallel configuration, while the wiper transistor allows incorporation of each series resistance to be applied.

The second constraint to achieve all minimum increment (R) taps may be ensured by determining the end-to-end resistance using the following formula:

$$R_{end-to-end} = R_{max} + R_{min},$$

where $R_{max}$ is the maximum resistance that may be configured up to the center (labeled as O in FIG. 2) of the network array 200 (i.e., configured with one-half of the network array); and $R_{min}$ is the minimum resistance that may be configured up to the center (labeled as O in FIG. 2) of the network array 200.

In FIG. 2, $R_{max}$ is 14R and $R_{min}$ is 7R. Hence, in this configuration, $R_{min} = R_{max}/2$. Furthermore, $R_{end-to-end} = 14R + 7R = 21R$. This end-to-end resistance satisfies the two constraints and generates all the possible 22 taps for the 21R potentiometer 200. Accordingly, 1R is achieved, for example, on the H-to-W side by turning on transistors T1 and $T_w2$. This requires 20R on the rest of the network array on the W-to-L side by turning on transistors T2 and T3. 2R is achieved on the H-to-W side by turning on transistor $T_w2$. This requires 19R on the rest of the network array on the W-to-L side by turning on transistors T2, $T_w3$, and T6. Furthermore, 3R is achieved on the H-to-W side by turning on transistors T1, T2, and T3. This requires 18R on the rest of the network array on the W-to-L side by turning on T3. Similar arrangements may be configured to provide the rest of the resistance values from 4R to 21R, at an increment of 1R.

Figure 3:
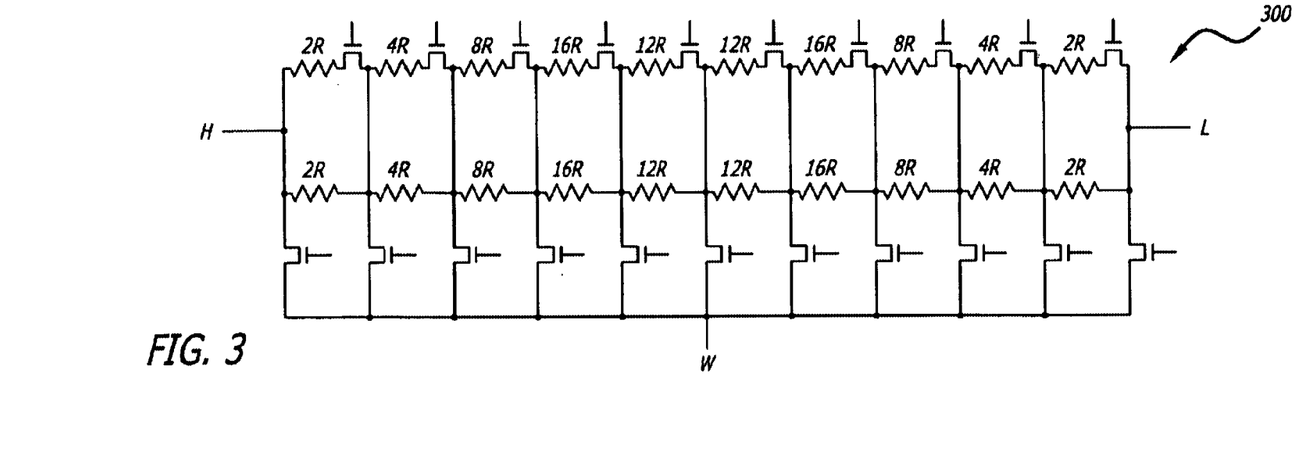
FIG. 3 illustrates a resistor network configuration for 64-tap potentiometer.

Table 1 shows resistor network configurations for 64, 128, and 256 tap potentiometer configurations, and their resistance construction values and sequence. Although the table shows only three configurations, further configurations with any number of steps may be arranged similarly. As an example, FIG. 3 illustrates a resistor network configuration 300 for 64-tap potentiometer.

TABLE 1

| Total Step | $R_{TOTAL}$ | $R_{MIN}$ | $R_{MAX}$ | Network Configuration |
|---|---|---|---|---|
| 64 | 63R | 21R | 42R | 2R, 4R, 8R, 16R, 12R, 12R, 16R, 8R, 4R, 2R |
| 128 | 127R | 41R | 86R | 2R, 4R, 8R, 16R, 32R, 24R, 24R, 32R, 16R, 8R, 4R, 2R |
| 256 | 255R | 85R | 170R | 2R, 4R, 8R, 16R, 32R, 64R, 44R, 44R, 64R, 32R, 16R, 8R, 4R, 2R |

Figure 4:
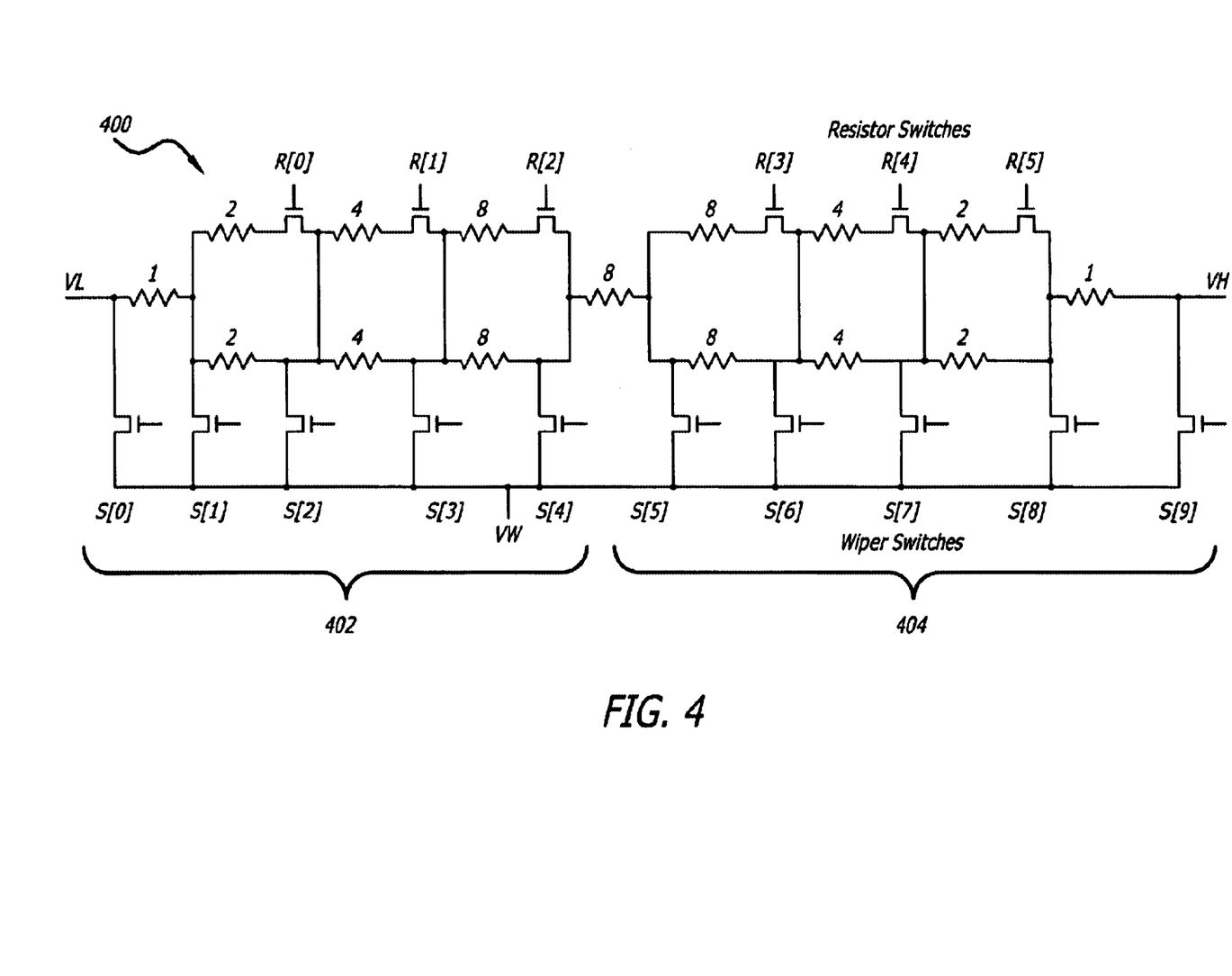
FIG. 4 illustrates a three terminal potentiometer implemented with a variable resistive network in accordance with an embodiment of the invention.

FIG. 4 illustrates a three terminal potentiometer implemented with a variable resistive network 400 in accordance with an embodiment of the invention. However, the network 400 may be implemented with any impedance elements. The network 400 has been configured to overcome some of the difficulties presented in the networks 200, 300 of FIGS. 2 and 3, and tabulated in Table 1.

In the illustrated embodiment, the network 400 is configured with resistor elements connected in parallel and in series depending on the controls to the switches. Furthermore, these resistor element values are chosen such that it compliments a binary numbering scheme. Hence, the improved binary-based resistor network 400 was designed with two goals in mind: to create an easily expandable resistor network pattern that allows for equal step increments of 32, 64, 128, 256, etc; and has simple decoding scheme.

The illustrated resistor network 400 includes a pair of 1R resistors before parallel combinations of 2R, 4R, 8R, etc., at the two end terminals. The network also includes a single resistor element in the middle of the network. This resistor element is chosen based on the number of resistor steps desired. Moreover, the network 400 is designed in such a way that the second half 404 of the network 400 is a mirrored version of the first half 402 (i.e., 1R-2R-4R-8R in the first half and 8R-4R-2R-1R in the second half). Hence, the total resistance of this network 400 is 1R+2R+4R+8R+8R+(8R+4R+2R)/2+1R=31R, which creates 32 resistor steps. This mirrored configuration may be extended to any number of binary configurations.

Further, the mirrored configurations of the network 400 enables the controls of the pass gate switches, R[x], to be created by the inverse of the input bits (for the first half 402 of the network 400), and the input bits themselves (for the second half 404 of the network 400). Because the resistor controls to the two halves 402, 404 of the network 400 are mutually exclusive, the network 400 almost always sees a combination of one resistance (2R+4R+8R) and a parallel combination of that resistance (2R/2+4R/2+8R/2). This keeps the total end-to-end resistance constant, regardless of which combinations of series and parallel resistors were used in the first half 402 of the network 400.

The controls for the first half 402 of the wiper switches, S[x], are determined by the first 1 in the most significant position of the digital input. Controls for the second half 404 of the wiper switches, S[x], are determined by the first 0 in the most significant position of the digital input. Table 2 illustrates the implementation of the controls for the pass gate and wiper switches.

The illustrated network 400 has been described in terms of configuration used for digital inputs of 5 bits to create 32 1R resistance steps. However, the advantage is that the network 400 is readily applicable to a digital input of any bit length, so long as the necessary resistor components are added or subtracted. For example, if a digital input of 8 bits is to be used, the network may be expanded to 1R(s), 2R, 4R, 8R, 16R, 32R, 64R, 64R(s), 64R, 32R, 16R, 8R, 4R, 2R, 1R(s), where (s) indicates a single resistor. Hence, this configuration follows the same pattern as the 32-step network. Table 3 illustrates circuit implementations of different number of resistor taps. Wiper and resistor switching controls for the new stages also follow the same patterns as before but expanded to accommodate for 8 input bits. No extra decoding logic needs to be developed and no patterns need to be established.

| | | WIPER CONTROLS | | | | | | | | | | PASS GATE CONTROLS | | | | | |
|---|---|---|---|---|---|---|---|---|---|---|---|---|---|---|---|---|---|
| Decimal | Binary | S0 | S1 | S2 | S3 | S4 | S5 | S6 | S7 | S8 | S9 | Binary | R0 | R1 | R2 | R3 | R4 | R5 |
| 0 | 00000 | 1 | 0 | 0 | 0 | 0 | 0 | 0 | 0 | 0 | 0 | 00000 | 1 | 1 | 1 | 0 | 0 | 0 |
| 1 | 00001 | 0 | 1 | 0 | 0 | 0 | 0 | 0 | 0 | 0 | 0 | 00001 | 0 | 1 | 1 | 0 | 0 | 1 |
| 2 | 00010 | 0 | 0 | 1 | 0 | 0 | 0 | 0 | 0 | 0 | 0 | 00010 | 1 | 0 | 1 | 0 | 1 | 0 |
| 3 | 00011 | 0 | 0 | 1 | 0 | 0 | 0 | 0 | 0 | 0 | 0 | 00011 | 0 | 0 | 1 | 0 | 1 | 1 |
| 4 | 00100 | 0 | 0 | 0 | 1 | 0 | 0 | 0 | 0 | 0 | 0 | 00100 | 1 | 1 | 0 | 1 | 0 | 0 |
| 5 | 00101 | 0 | 0 | 0 | 1 | 0 | 0 | 0 | 0 | 0 | 0 | 00101 | 0 | 1 | 0 | 1 | 0 | 1 |
| 6 | 00110 | 0 | 0 | 0 | 1 | 0 | 0 | 0 | 0 | 0 | 0 | 00110 | 1 | 0 | 0 | 1 | 1 | 0 |
| 7 | 00111 | 0 | 0 | 0 | 1 | 0 | 0 | 0 | 0 | 0 | 0 | 00111 | 0 | 0 | 0 | 1 | 1 | 1 |
| 8 | 01000 | 0 | 0 | 0 | 0 | 1 | 0 | 0 | 0 | 0 | 0 | 01000 | 1 | 1 | 1 | 0 | 0 | 0 |
| 9 | 01001 | 0 | 0 | 0 | 0 | 1 | 0 | 0 | 0 | 0 | 0 | 01001 | 0 | 1 | 1 | 0 | 0 | 1 |
| 10 | 01010 | 0 | 0 | 0 | 0 | 1 | 0 | 0 | 0 | 0 | 0 | 01010 | 1 | 0 | 1 | 0 | 1 | 0 |
| 11 | 01011 | 0 | 0 | 0 | 0 | 1 | 0 | 0 | 0 | 0 | 0 | 01011 | 0 | 0 | 1 | 0 | 1 | 1 |
| 12 | 01100 | 0 | 0 | 0 | 0 | 1 | 0 | 0 | 0 | 0 | 0 | 01100 | 1 | 1 | 0 | 1 | 0 | 0 |
| 13 | 01101 | 0 | 0 | 0 | 0 | 1 | 0 | 0 | 0 | 0 | 0 | 01101 | 0 | 1 | 0 | 1 | 0 | 1 |
| 14 | 01110 | 0 | 0 | 0 | 0 | 1 | 0 | 0 | 0 | 0 | 0 | 01110 | 1 | 0 | 0 | 1 | 1 | 0 |
| 15 | 01111 | 0 | 0 | 0 | 0 | 1 | 0 | 0 | 0 | 0 | 0 | 01111 | 0 | 0 | 0 | 1 | 1 | 1 |
| 16 | 10000 | 0 | 0 | 0 | 0 | 0 | 1 | 0 | 0 | 0 | 0 | 10000 | 1 | 1 | 1 | 0 | 0 | 0 |
| 17 | 10001 | 0 | 0 | 0 | 0 | 0 | 1 | 0 | 0 | 0 | 0 | 10001 | 0 | 1 | 1 | 0 | 0 | 1 |
| 18 | 10010 | 0 | 0 | 0 | 0 | 0 | 1 | 0 | 0 | 0 | 0 | 10010 | 1 | 0 | 1 | 0 | 1 | 0 |

-continued

| | | WIPER CONTROLS | | | | | | | | | | PASS GATE CONTROLS | | | | | | |
|---|---|---|---|---|---|---|---|---|---|---|---|---|---|---|---|---|---|---|
| Decimal | Binary | S0 | S1 | S2 | S3 | S4 | S5 | S6 | S7 | S8 | S9 | Binary | R0 | R1 | R2 | R3 | R4 | R5 |
| 19 | 10011 | 0 | 0 | 0 | 0 | 0 | 1 | 0 | 0 | 0 | 0 | 10011 | 0 | 0 | 1 | 0 | 1 | 1 |
| 20 | 10100 | 0 | 0 | 0 | 0 | 0 | 1 | 0 | 0 | 0 | 0 | 10100 | 1 | 1 | 0 | 1 | 0 | 0 |
| 21 | 10101 | 0 | 0 | 0 | 0 | 0 | 1 | 0 | 0 | 0 | 0 | 10101 | 0 | 1 | 0 | 1 | 0 | 1 |
| 22 | 10110 | 0 | 0 | 0 | 0 | 0 | 1 | 0 | 0 | 0 | 0 | 10110 | 1 | 0 | 0 | 1 | 1 | 0 |
| 23 | 10111 | 0 | 0 | 0 | 0 | 0 | 1 | 0 | 0 | 0 | 0 | 10111 | 0 | 0 | 0 | 1 | 1 | 1 |
| 24 | 11000 | 0 | 0 | 0 | 0 | 0 | 0 | 1 | 0 | 0 | 0 | 11000 | 1 | 1 | 1 | 0 | 0 | 0 |
| 25 | 11001 | 0 | 0 | 0 | 0 | 0 | 0 | 1 | 0 | 0 | 0 | 11001 | 0 | 1 | 1 | 0 | 0 | 1 |
| 26 | 11010 | 0 | 0 | 0 | 0 | 0 | 0 | 1 | 0 | 0 | 0 | 11010 | 1 | 0 | 1 | 0 | 1 | 0 |
| 27 | 11011 | 0 | 0 | 0 | 0 | 0 | 0 | 1 | 0 | 0 | 0 | 11011 | 0 | 0 | 1 | 0 | 1 | 1 |
| 28 | 11100 | 0 | 0 | 0 | 0 | 0 | 0 | 0 | 1 | 0 | 0 | 11100 | 1 | 1 | 0 | 1 | 0 | 0 |
| 29 | 11101 | 0 | 0 | 0 | 0 | 0 | 0 | 0 | 1 | 0 | 0 | 11101 | 0 | 1 | 0 | 1 | 0 | 1 |
| 30 | 11110 | 0 | 0 | 0 | 0 | 0 | 0 | 0 | 0 | 1 | 0 | 11110 | 1 | 0 | 0 | 1 | 1 | 0 |
| 31 | 11111 | 0 | 0 | 0 | 0 | 0 | 0 | 0 | 0 | 0 | 1 | 11111 | 0 | 0 | 0 | 1 | 1 | 1 |

TABLE 3

Resistor network implementations for various number of tap positions

| Resistor Taps | Resistor Network Design. All elements represent a pair of resistors, one with a pass-gate, one without note: (s) designates only single resistor |
|---|---|
| 32 | 1R(s), 2R, 4R, 8R, 8R(s), 8R, 4R, 2R, 1R(s) |
| 64 | 1R(s), 2R, 4R, 8R, 16R, 16R(s), 16R, 8R, 4R, 2R, 1R(s) |
| 128 | 1R(s), 2R, 4R, 8R, 16R, 32R, 32R(s), 32R, 16R, 8R, 4R, 2R, 1R(s) |
| 256 | 1R(s), 2R, 4R, 8R, 16R, 32R, 64R, 64R(s), 64R, 32R, 16R, 8R, 4R, 2R, 1R(s) |
| 512 | 1R(s), 2R, 4R, 8R, 16R, 32R, 64R, 128R, 128R(s), 128R, 64R, 32R, 16R, 8R, 4R, 2R, 1R(s) |
| 1024 | 1R(s), 2R, 4R, 8R, 16R, 32R, 64R, 128R, 256R, 256R(s), 256R, 128R, 64R, 32R, 16R, 8R, 4R, 2R, 1R(s) |

Figure 5:
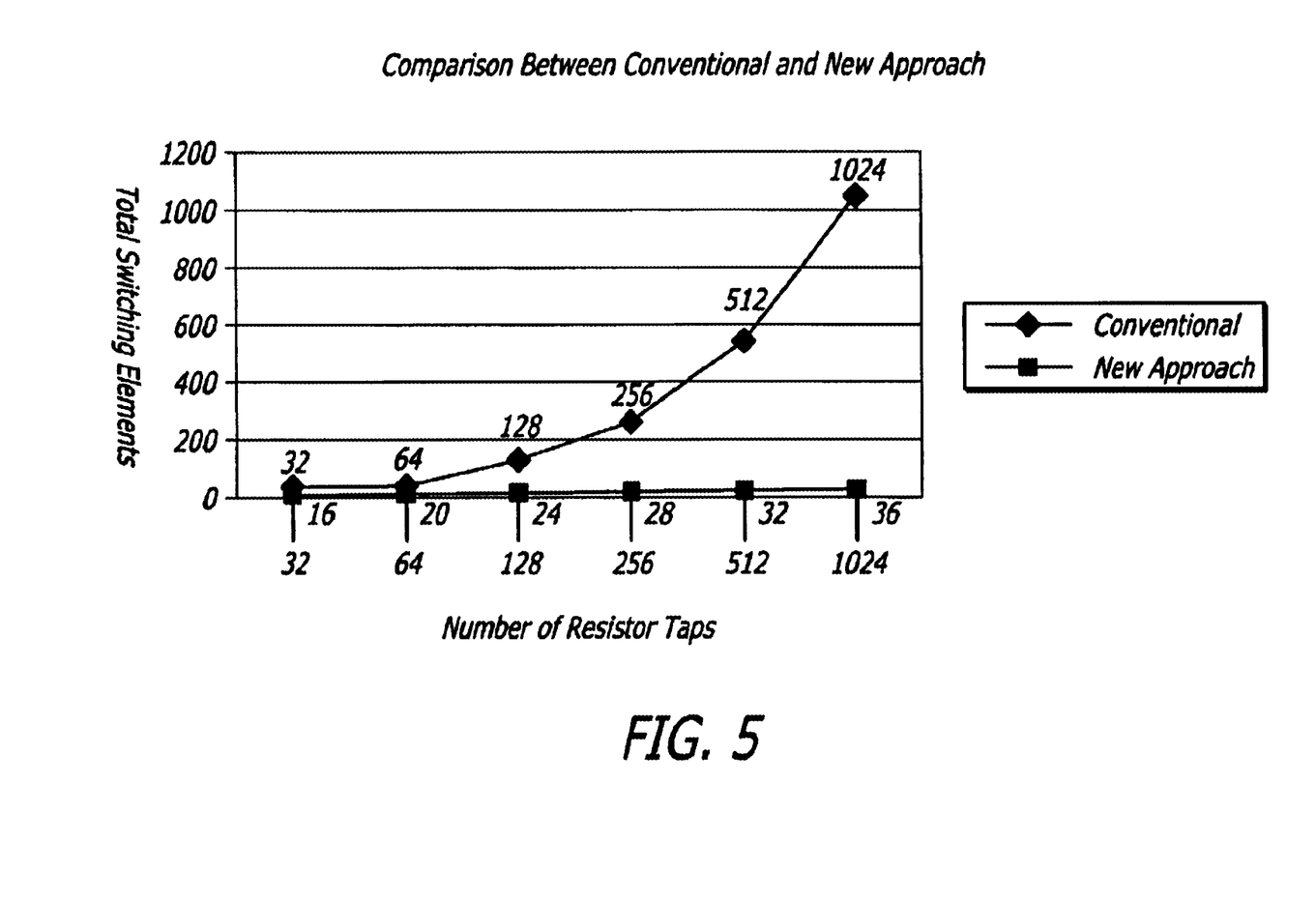
FIG. 5 is a graph comparing wiper/pass transistors used by the conventional approach to the improved approach.

The improved binary-based network 400 still maintains the advantages of the original binary-based network 200, 300, including the reduced parasitic capacitance and fewer number of wiper transfer switches. However, the improved network 400 provides further advantage by having fewer total unit resistors and total pass gates. Table 4 shows the difference between the resources used by the conventional approach 100, the original binary-based network approach 200, 300, and the improved binary-based approach 400. FIG. 5 is a graph comparing wiper/pass transistors used by the conventional approach to the improved approach.

During switching from one tap to the other tap, the wiper transistors switch on and off based on the tap selection address. During the wiper transistor switching (one turning of the other turning off), an overlap time is intentionally introduced to keep the output impedance of the wiper stable. Therefore, one difficulty faced by the improved binary-based approach is that both wiper devices are turned on momentarily. This essentially creates a short through part of the resistor network and the end-to-end total resistance of the network is effectively reduced by the amount the wiper switches shorted out. In the original binary-based network and the improved binary-based network, the maximum resistance reduction occurs across the 64R elements for a 256 tap resistive network. This creates a 25% reduction in end-to-end resistance. However, such a high operational variation in end-to-end resistance is undesirable for a system where the end-to-end resistance transiently changes during the tap position change.

TABLE 4

Element counts in the Conventional (C), Original Binary-based (O), and Improved Binary Based (I) approach

| Resistor Taps | resistor elements | | | total unit resistors | | | wiper elements | | | total switching elements | | |
|---|---|---|---|---|---|---|---|---|---|---|---|---|
| | C | O | I | C | O | I | C | O | I | C | O | I |
| 32 | 31 | N/A | 15 | 31 | N/A | 66 | 32 | N/A | 10 | 32 | N/A | 16 |
| 64 | 63 | 20 | 19 | 63 | 168 | 138 | 64 | 11 | 12 | 64 | 31 | 20 |
| 128 | 127 | N/A | 23 | 127 | N/A | 282 | 128 | N/A | 14 | 128 | N/A | 24 |
| 256 | 255 | 28 | 27 | 255 | 680 | 570 | 256 | 15 | 16 | 256 | 43 | 28 |
| 512 | 511 | N/A | 31 | 511 | N/A | 1146 | 512 | N/A | 18 | 512 | N/A | 32 |
| 1024 | 1023 | 36 | 35 | 1023 | 2728 | 2298 | 1024 | 19 | 20 | 1024 | 55 | 36 |

TABLE 5

Serial/Binary (SB) based approach 256 tap design

1R(s), 2R, 4R, 8R, 16R, 32R, 64R, 64R(s), 64R, 32R, 16R, 8R, 4R, 2R, 1R(s)
1R(s), 2R, 4R, 8R, 16R, 16, 16, 16, 16, 16, 16, 16, 16, 16, 16, 16, 16, 16R, 8R, 4R, 2R, 1R(s)

In a new network approach, referred to as a serial/binary-based approach, instead of having the middle 32R, 64R, 64R(s), 64R, 32R stages, the middle stage is replaced with an equivalent string of thirteen 16R resistors. Total end-to-end resistance still remains at 255R. Table 5 shows the new configuration of the network. In this embodiment, since the largest element in the network is 16R, shorting out that largest element results in roughly a 6% decrease in resistance, which a much more acceptable variation. This concept may be extended to any number of tap designs.

Figure 6:
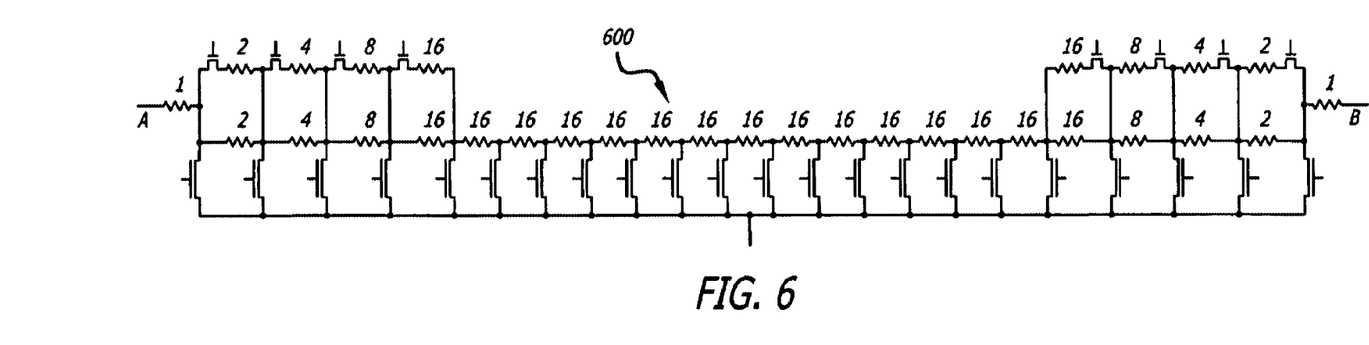
FIG. 6 shows a schematic representation of the 256-tap serial/binary-based network in accordance with an embodiment of the invention.

FIG. 6 shows a schematic representation of the 256-tap serial/binary-based network 600 in accordance with an embodiment of the invention. This network 600 minimizes the transient end-to-end resistance change during the tap position switching condition. Furthermore, the amount of the change is proportional to the value of the largest resistor elements between wiper transistors. Hence, this approach 600 shares the advantages of the original binary, and improved binary approaches, but also reduces the resistor switches/pass devices to improve the end-to-end resistance variation. Although the serial/binary approach 600 requires additional wiper transistors compared to the strictly binary approach, this serial/binary approach 600 requires less wiper transistors than the conventional approach. For example, by replacing the middle stages with a series of 16R resistors, the new network 600 requires 8 extra wiper switches. On the plus side, the new network 600 requires 4 less pass gate switches. Therefore the total difference is only 4 extra switch elements.

The network 600 uses pass gates switches to connect the binary resistors. These pass gate switches have a parasitic resistance that introduces an error into the wiper node, and into the end-to-end resistance. This error may have adverse impact on the performance parameters of the potentiometer such as Integral non-linearity (INL), and differential non-linearity (DNL). Hence, to minimize this error, a trimming network 700 may be implemented at the two ends of a resistance network, such as the network 600.

FIG. 7A shows the implementation of the trim option circuit 700. The trimming network 700 generates resistance ranging from 0.5 to 4.0 R. By providing a nonvolatile memory that controls the pass gates, it is possible to trim the potentiometer for every step and significantly improve the linearity of the resistance network. Table 6 shows the values of the trim circuit.

TABLE 6

| ideal | actual |
|---|---|
| 1 | 1.3607 |
| 1.25 | 1.7178 |
| 1.5 | 1.7679 |
| 1.75 | 2.125 |
| 2 | 2.194 |
| 2.2 | 2.4483 |

TABLE 6-continued

| ideal | actual |
|---|---|
| 2.5 | 2.7245 |
| 3 | 3.0816 |
| 3.5 | 3.6429 |
| 4 | 4 |

Figure 7B:
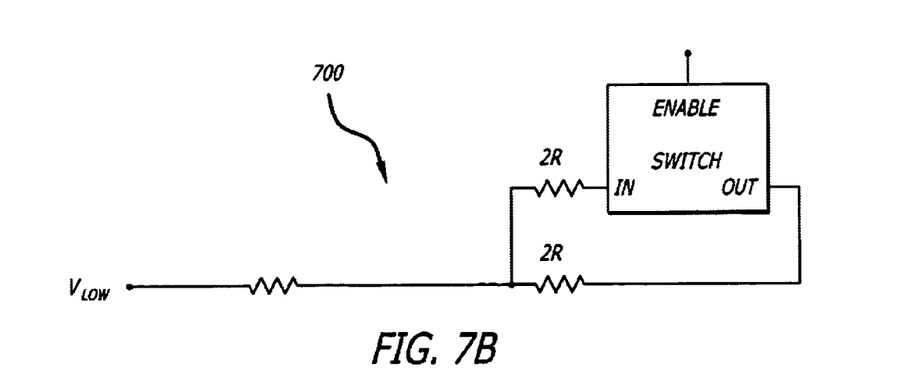
FIG. 7B shows one implementation of a resistive network without the trimming circuit.

The ideal column indicated the resistance values that may be obtained by ignoring any parasitic resistance from the pass gate switches. The actual column indicates the resistance values that may be obtained by assuming that a pass gate switch has a 0.8R value. FIG. 7B shows the network 700 without the trimming circuit.

Figure 8A:
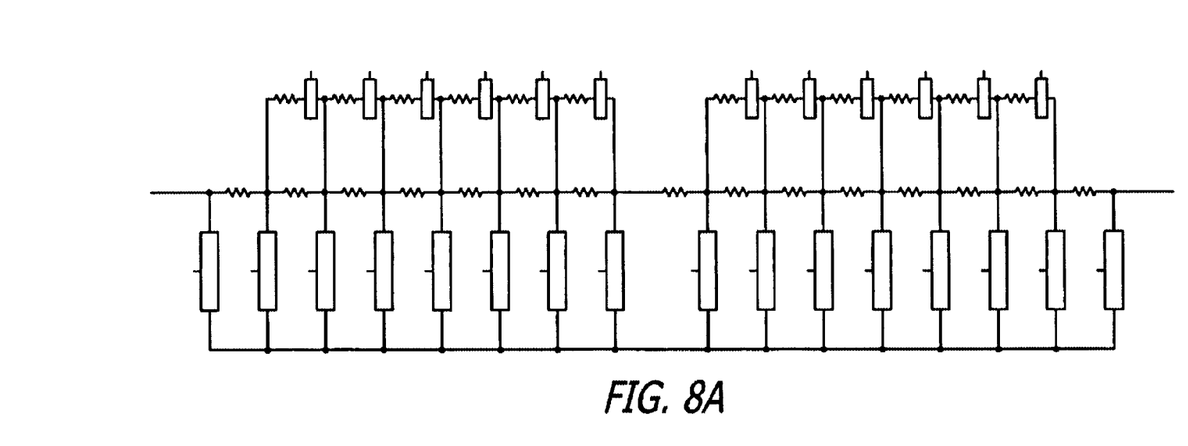
FIG. 8A shows the binary-based resistor network with a trimming circuit.
Figure 8B:
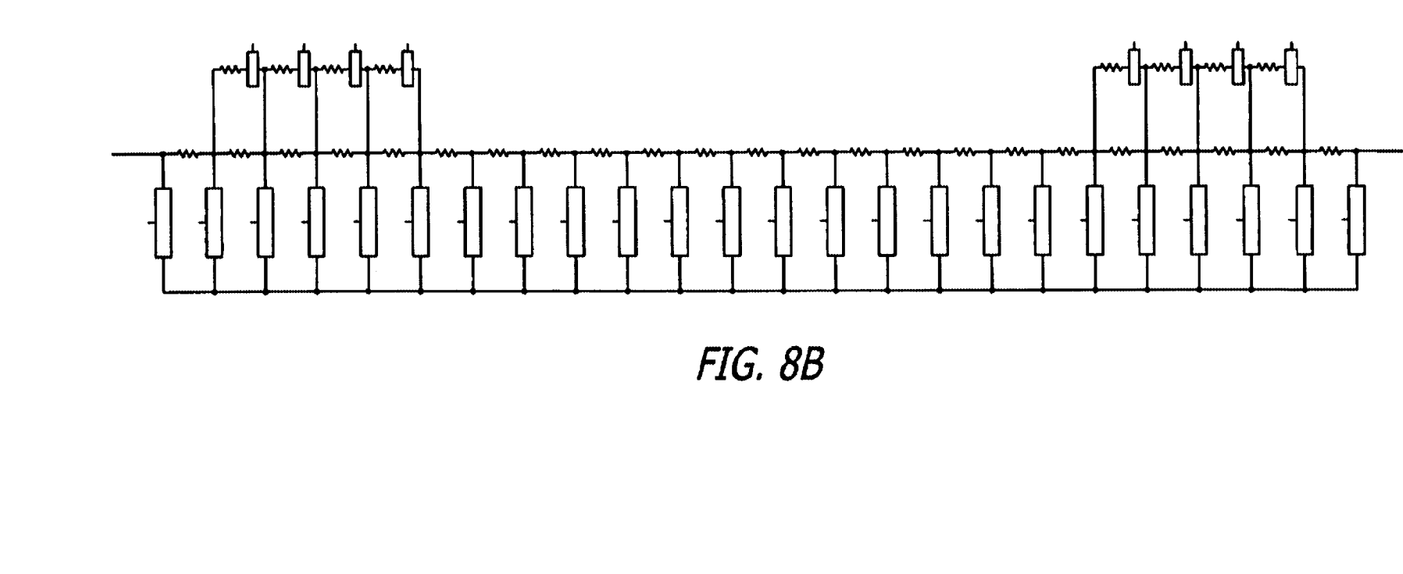
FIG. 8B shows a serial/binary-based resistor network with a trimming circuit.

FIGS. 8A and 8B show the binary-based resistor network with a trimming circuit, and the serial/binary-based resistor network with a trimming circuit, respectively.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. In other instances, well-known structures and functions were not described in elaborate detail in order to avoid obscuring the subject matter of the present invention. Accordingly, the scope and spirit of the invention should be judged in terms of the claims which follow.

What is claimed is:

1. An impedance network comprising:
   a first plurality of impedance elements coupled in series, the series connection having at least one center impedance element, an impedance element at each end of the series connection of the first plurality of impedance elements, and equal pluralities of impedance elements between each end impedance element and the at least one center impedance element;
   a second plurality of impedance elements;
   a first plurality of switching elements each coupled in series with a respective one of the second plurality of impedance elements, each series connection of one of the second plurality of impedance elements and a respective one of the first plurality of switching elements being coupled in parallel with a respective one of the pluralities of first impedance elements between each end impedance element and the at least one center impedance element of the series connection of first impedance elements;
   a wiper terminal; and,
   a second plurality of switching elements coupled between nodes between impedance elements in the first plurality of impedance elements and the wiper terminal.

2. The impedance network of claim 1 wherein the at least one center impedance element comprises one center impedance element.

3. The impedance network of claim 2 wherein the values of the impedance elements in the first plurality of impedance elements are symmetrical around the center impedance element.

4. The impedance network of claim 3 wherein the values of the impedance elements in the first plurality of impedance elements progressively increase from each end impedance element to the impedance elements adjacent center impedance element.

5. The impedance network of claim 4 wherein the value of the center impedance element is the same as the value of the impedance elements in the first plurality of impedance elements adjacent the center impedance element.

6. The impedance network of claim 5 wherein the impedance element in each series connection of one of the second plurality of impedance elements and a respective one of the plurality of first switching elements that is coupled in parallel with a respective one of the first plurality of impedance elements is equal in value to the respective one of the first plurality of impedance elements.

7. The impedance network of claim 5 wherein the values of the impedance elements in the first plurality of impedance elements progressively increase from each end impedance element to the impedance elements adjacent the center impedance element in a binary progression.

8. The impedance network of claim 7 wherein all impedance elements are resistive impedance elements.

9. The impedance network of claim 1 further comprised of trim circuitry for minimizing errors due to parasitic switch resistance of the first plurality of switching elements.

10. The impedance network of claim 9 wherein the trim circuitry trims the impedance network for every change in state of the first plurality of switching elements.

11. The impedance network of claim 10 wherein the trim circuitry comprises circuitry coupled to the impedance elements at the ends of the impedance network.

12. The impedance network of claim 11 wherein all impedance elements are resistive impedance elements.

13. The impedance network of claim 1 wherein the at least one center impedance element comprises an odd plurality of center impedance element.

14. The impedance network of claim 13 wherein the values of the impedance elements in the first plurality of impedance elements are symmetrical around the odd plurality of center impedance elements.

15. The impedance network of claim 14 wherein the values of the impedance elements in the first plurality of impedance elements progressively increase from each end impedance element to the impedance elements adjacent center impedance element.

16. The impedance network of claim 15 wherein the value of each of the center impedance elements is the same as the value of the impedance elements in the first plurality of impedance elements adjacent the center impedance elements.

17. The impedance network of claim 16 wherein the impedance element in each series connection of one of the second plurality of impedance elements and a respective one of the plurality of first switching elements that is coupled in parallel with a respective one of the first plurality of impedance elements is equal in value to the respective one of the first plurality of impedance elements.

18. The impedance network of claim 16 wherein the values of the impedance elements in the first plurality of impedance elements progressively increase from each end impedance element to the impedance elements adjacent center impedance element in a binary progression.

19. The impedance network of claim 18 wherein all impedance elements are resistive impedance elements.

20. The impedance network of claim 19 further comprised of trim circuitry coupled to the impedance elements t the ends of the impedance network for minimizing errors due to parasitic switch resistance of the first plurality of switching elements.

21. The impedance network of claim 20 wherein the trim circuitry trims the impedance network for every change in state of the first plurality of switching elements.

22. A resistor network comprising:
a first plurality of resistors coupled in series, the series connection having a center resistor, a resistor at each end of the series connection of the first plurality of resistors, and equal pluralities of resistors between each end resistor and the center resistor;
a second plurality of resistors;
a first plurality of switching elements each coupled in series with a respective one of the second plurality of resistors, each series connection of one of the second plurality of resistors and a respective one of the first plurality of switching elements being coupled in parallel with a respective one of the pluralities of first resistors between each end resistor and the center resistor of the series connection of first resistors;
a wiper terminal; and,
a second plurality of switching elements coupled between nodes between resistors in the first plurality of resistors and the wiper terminal.

23. The resistor network of claim 22 further comprised of trim circuits coupled in parallel with the end and next to the end resistors of the first plurality of resistors.

24. The resistor network of claim 23 wherein the values of the resistors in the first plurality of resistors are symmetrical around the center resistor.

25. The resistor network of claim 24 wherein the values of the resistors in the first plurality of resistors progressively increase from each end resistor to the resistors adjacent the center resistor.

26. The resistor network of claim 25 wherein the value of the center resistor is the same as the value of the resistors in the first plurality of resistors adjacent the center resistor.

27. The resistor network of claim 26 wherein the values of the resistors in the first plurality of resistors other than the end and next to the end resistors of the first plurality of resistors progressively increase in value in a binary progression to the resistors adjacent the center resistor.

28. The resistor network of claim 27 wherein the center resistor has the same value as the resistors adjacent the center resistor.

29. The resistor network of claim 28 wherein the trim circuitry trims the resistor network for every change in state of the first plurality of switching elements.

30. A resistor network comprising:
a first plurality of resistors coupled in series, the series connection having an odd plurality of center resistors, a resistor at each end of the series connection of the first plurality of resistors, and equal pluralities of resistors between each end resistor and the center resistors;
a second plurality of resistors;
a first plurality of switching elements each coupled in series with a respective one of the second plurality of resistors, each series connection of one of the second plurality of resistors and a respective one of the first plurality of switching elements being coupled in parallel with a respective one of the pluralities of first resistors between each end resistor and the odd plurality of center resistors of the series connection of first resistors;

a wiper terminal; and, a second plurality of switching elements coupled between nodes between resistors in the first plurality of resistors and the wiper terminal.

31. The resistor network of claim 30 further comprised of trim circuits coupled in parallel with the end and next to the end resistors of the first plurality of resistors.

32. The resistor network of claim 31 wherein the values of the resistors in the first plurality of resistors are symmetrical around the odd plurality of center resistors.

33. The resistor network of claim 32 wherein the values of the resistors in the first plurality of resistors progressively increase from each end resistor to the resistors adjacent the odd plurality of center resistors.

34. The resistor network of claim 33 wherein the value of the center resistors is the same as the value of the resistors in the first plurality of resistors adjacent the center resistors.

35. The resistor network of claim 34 wherein the values of the resistors in the first plurality of resistors other than the end and next to the end resistors of the first plurality of resistors progressively increase in value in a binary progression to the resistors adjacent odd plurality of center resistors.

36. The resistor network of claim 35 wherein the center resistors have the same value as the resistors adjacent the center resistors.

37. The resistor network of claim 36 wherein the trim circuitry trims the resistor network for every change in state of the first plurality of switching elements.

* * * * *